United States Patent [19]
Funaki

[11] Patent Number: 6,069,396
[45] Date of Patent: May 30, 2000

[54] HIGH BREAKDOWN VOLTAGE SEMICONDUCTOR DEVICE

[75] Inventor: Hideyuki Funaki, Tokyo, Japan

[73] Assignee: Kabushiki Kaisha Toshiba, Kawasaki, Japan

[21] Appl. No.: 09/040,305

[22] Filed: Mar. 18, 1998

[30] Foreign Application Priority Data

Mar. 18, 1997 [JP] Japan ................................... 9-064934

[51] Int. Cl.[7] .................................................. H01L 23/58
[52] U.S. Cl. .......................... 257/492; 257/493; 257/341; 257/355; 257/500
[58] Field of Search ...................... 257/341, 339, 257/328, 487, 488, 489, 490, 491, 492, 493, 494, 495, 496, 392, 500

[56] References Cited

U.S. PATENT DOCUMENTS

| | | | |
|---|---|---|---|
| 3,845,495 | 10/1974 | Cauge et al. ............................ | 257/336 |
| 5,241,210 | 8/1993 | Nakagawa et al. . | |
| 5,294,825 | 3/1994 | Nakagawa et al. ...................... | 257/487 |
| 5,592,014 | 1/1997 | Funaki et al. ........................... | 257/487 |
| 5,640,040 | 6/1997 | Nakagawa et al. ...................... | 257/487 |
| 5,801,431 | 9/1998 | Ranjan .................................... | 257/659 |
| 5,861,657 | 1/1999 | Ranjan .................................... | 257/492 |
| 5,874,768 | 2/1999 | Yamaguchi et al. ..................... | 257/493 |

OTHER PUBLICATIONS

Akio Nakagawa, et al., "New High Voltage SOI Device Structure Eliminating Substrate Bias Effects," 1996 IEEE IEDM Tech. Digest, (1996), pp. 477–480.

Tatsuhiko Fujihara, et al., "Self–Shielding: New High–Voltage Inter–Connection Technique For HVICs," Proc. of '96 ISPSD,(1996), pp. 231–234.

Primary Examiner—Tom Thomas
Assistant Examiner—Shouxiang Hu
Attorney, Agent, or Firm—Oblon, Spivak, McClelland, Maier & Neustadt, P.C.

[57] ABSTRACT

The high breakdown voltage semiconductor device comprises an insulating film, a semi-insulating high resistance film formed on the insulating film, a first semiconductor layer of the first conductivity type formed on the high resistance film, a second semiconductor layer of the second conductivity type formed on a surface of the first semiconductor layer, a third semiconductor layer of the first conductivity type formed on the surface of the first semiconductor layer so as to be apart from the second semiconductor layer, and having an impurity concentration higher than that of the first semiconductor layer, and a resurf layer formed in a space between the second and third semiconductor layers on the surface of the first semiconductor layer, and having an impurity concentration lower than that of the second semiconductor layer.

15 Claims, 8 Drawing Sheets

HIGH BREAKDOWN VOLTAGE SEMICONDUCTOR DEVICE

BACKGROUND OF THE INVENTION

This invention relates to a high breakdown voltage semiconductor device, particularly to a high breakdown voltage semiconductor device employing an SOI (Silicon On Insulator) substrate.

So-called power IC, wherein a high breakdown voltage semiconductor device and a peripheral circuit including a driving circuit of the high breakdown voltage semiconductor device and a protection circuit are integrated on one substrate is expected to be used in the field of power electronics, as a general purpose inverter, the IC used in a car, and the driver for a display. The power IC uses an SOL substrate since it can easily isolate the elements in the IC, and thus is convenient.

FIG. 1 is a plan view showing a lateral type high breakdown voltage diode formed on a conventional SOI substrate. FIG. 2 is a sectional view of the diode taken along a line II—II. In these drawings, 81 denotes the first silicon substrate above which an n-type second silicon substrate 83 is formed to hold an $SiO_2$ film 82 therebetween.

The first silicon substrate 81, the $SiO_2$ film 82, and the n-type second silicon substrate 83 constitute the SOI substrate. The SOI substrate is formed in accordance with a method such as the bonding method or the SIMOX (Separation by IMplanted OXygen) method. The n-type second silicon substrate 83 (hereinafter referred to as an n type drift layer) has a high impurity p-type anode layer 84 and an n-type cathode layer 85, selectively formed on the surface thereof.

The n-type second silicon substrate 83 has an interlayer insulating film 86 thereon. An anode electrode 87 and a cathode electrode 88 contact with the p-type anode layer 84 and the n-type cathode layer 85 respectively, via contact holes formed in the interlayer insulating film 86.

In the space between the p-type anode layer 84 and the n-type cathode layer 85 on the surface of a n-type drift layer 83, an LOCOS (LOCal Oxidation of Silicon) film 89 is selectively formed. By adding the LOCOS film 89 in this manner, an insulating film formed under the interconnection wire 88a of the cathode electrode 88 is formed thick by the thickness of the LOCOS film 89 to increase the breakdown voltage of the device.

Such a lateral type high breakdown voltage diode, however, has the following problem:

The n-type drift layer 83 needs to be formed thick to ensure the necessary breakdown voltage, and the impurity concentration in the n-type drift layer 83 is set at a low level, in general. In such a structure, the ON resistance in this device is high.

In such a device, a potential inclination is generated on the surface of the n-type drift layer 83 (i.e., the element surface) in applying reverse-bias voltage, in which the potential on the side near the p-type anode layer 84 becomes lower than that on the side near the n-type cathode layer 85. With such a structure, the potential inclination as mentioned above is increased when the device is decreased in a chip size, and the breakdown voltage on the surface is deteriorated, as a result.

In consideration of the above, a high breakdown voltage semiconductor device which can prevent the deterioration of the breakdown voltage and the increase of the ON resistance, and prevent the deterioration of the breakdown voltage of the device without increasing the chip size of the element has been waited for.

BRIEF SUMMARY OF THE INVENTION

The first object of the present invention is to provide a high breakdown voltage semiconductor device employing an SOI substrate, which can prevent the deterioration of the breakdown voltage and the increase of the ON resistance, or can prevent the deterioration of the breakdown voltage of the device and the increase of the chip size of the element.

The second object of the present invention is to provide a high breakdown voltage semiconductor device having high reliability, in which a high breakdown voltage semiconductor device and a power semiconductor device are integrated in one chip.

In order to achieve the above object, the high breakdown voltage semiconductor device according to the first aspect of the present invention comprises: an insulating film; a semi-insulating high resistance film formed on the insulating film; a first semiconductor layer of the first conductivity type formed on the high resistance film; a second semiconductor layer of the second conductivity type formed on a surface of the first semiconductor layer; a third semiconductor layer of the first conductivity type formed on the surface of the first semiconductor layer so as to be apart from the second semiconductor layer, and having an impurity concentration higher than that of the first semiconductor layer; and a resurf layer selectively formed in a space between the second semiconductor layer and the third semiconductor layer on the surface of the first semiconductor layer, and having an impurity concentration lower than that of the second semiconductor layer.

The resurf layer preferably has an impurity concentration inclination in which an impurity concentration on a side of the second semiconductor layer is higher than that on a side of the third semiconductor layer.

The resurf layer is preferably formed to surround the third semiconductor layer.

The resurf layer preferably has the impurity concentration which is set to be higher as apart from the third semiconductor layer toward the second semiconductor layer.

The high breakdown voltage semiconductor device further comprises an interconnection wire which is connected to the third semiconductor layer, and extends in one direction on the first semiconductor layer, and the second semiconductor layer surrounds the third semiconductor layer so as to have an opening, and the interconnection wire extends outside the second semiconductor layer through the opening.

The high breakdown voltage semiconductor device further comprises an insulating layer formed on the first semiconductor layer, the insulating layer being formed thicker under at least one portion of the interconnection wire than the other portions thereof.

The high breakdown voltage semiconductor device according to the second aspect of the present invention has the structure of the device according to the first aspect of the present invention, and further comprises: a fourth semiconductor layer of the first conductivity type having an impurity concentration higher than that of the first semiconductor layer, which is formed on the second semiconductor layer; and a gate electrode formed in a space between the fourth semiconductor layer and the first semiconductor layer above a surface of the second semiconductor layer, with a gate insulating film interposed between the gate electrode and the second semiconductor layer.

The high breakdown voltage semiconductor device according to the third aspect of the present invention has the structure of the second aspect of the semiconductor device, and further comprises: a semiconductor element forming region isolated by a trench formed in a region on the first semiconductor layer, which is other than regions in which the second semiconductor layer and the third semiconductor layer are formed, the semiconductor element forming region has at least one semiconductor element formed therein.

According to the present invention, the semi-insulating high resistance film is formed under the bottom of the first semiconductor layer, and thus the voltage to be applied to the first semiconductor layer can be effectively shared by the high resistance film, and thus the voltage applied to the first semiconductor layer can be decreased.

Accordingly, in a case where the device can be formed with the breakdown voltage as small as the conventional one, the impurity concentration of the first semiconductor layer can be increased, whereby the ON resistance can be decreased. In another case where the device can be formed with the first semiconductor layer as thick as the conventional one, the breakdown voltage thereof can be improved. In still another case, the first semiconductor layer can be formed thin, and the ON resistance can be decreased. As described above, the present invention can prevent the deterioration of the breakdown voltage or the increase of the ON resistance.

In addition, the resurf layer is formed in the space between the second semiconductor layer and the third semiconductor layer located on the same plane, and thus the potential inclination on the element surface in the space between the second semiconductor layer and the third semiconductor layer on the same plane in the horizontal direction can be decreased.

Accordingly, in a case where the breakdown voltage on the element surface can be set as low as the conventional device, the element can be decreased in a chip size. In another case where the device can be formed with the chip size as large as the conventional device, the breakdown voltage on the element surface can be improved. In short, according to the present invention, the element surface can be prevented from increasing in the chip size, or the breakdown voltage can be prevented from being deteriorated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described with reference to the drawings. In the following embodiment, the n-type is described as the first conductivity, and the p-type is described as the second conductivity, but the conductivity types can be reversed.

The First Embodiment

Figure 3:
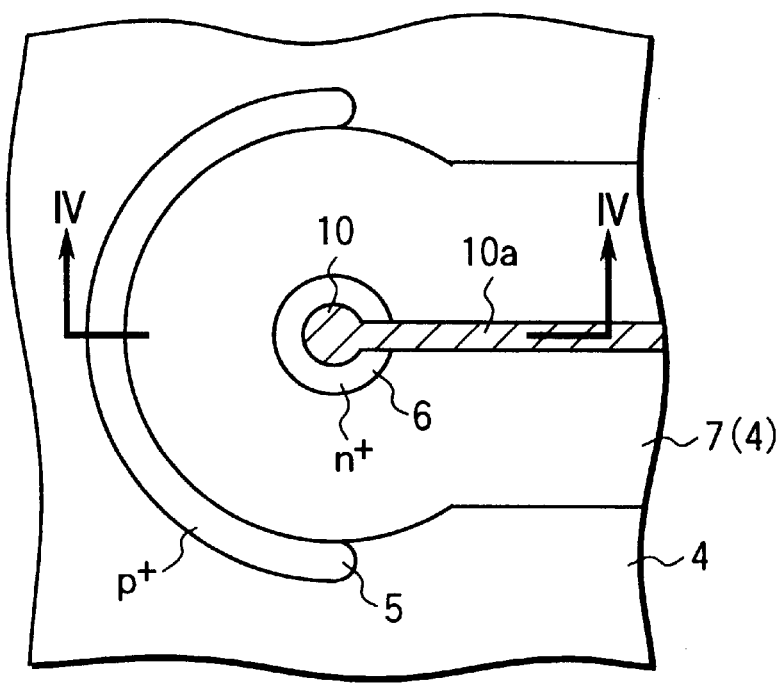
FIG. 3 is a plan view of the lateral type high breakdown voltage diode according to the first embodiment of the present invention.
Figure 4:
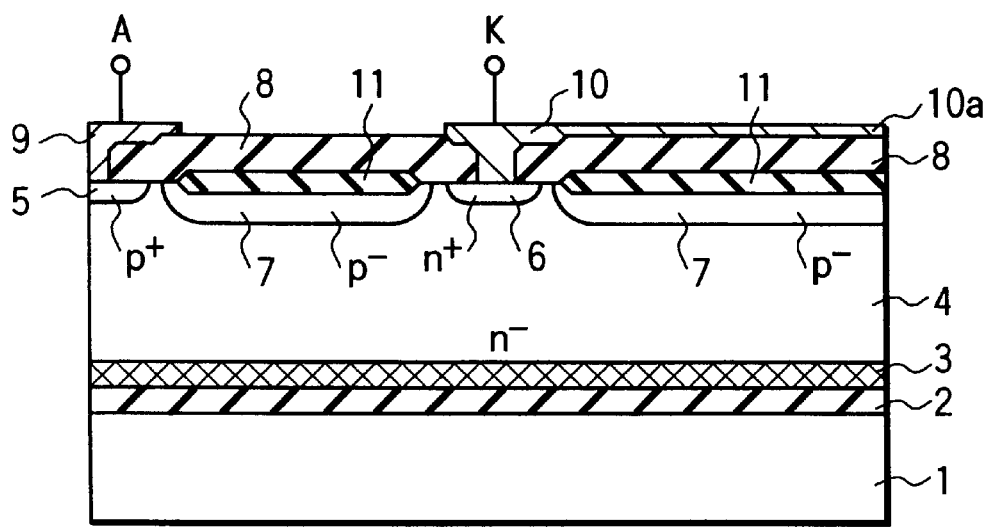
FIG. 4 is a sectional view of the diode shown in FIG. 3, taken along a line IV—IV.

FIG. 3 is a schematic plan view of the lateral type high breakdown voltage diode according to the first embodiment of the present invention. The drawing shows only the diode though the other semiconductor elements may be provided to the surrounding of the diode, in fact. FIG. 4 is a sectional view of the diode shown in FIG. 3, taken along a line IV—IV. FIG. 3 does not show insulating films 8 and 11 in the diode.

Figure 1:
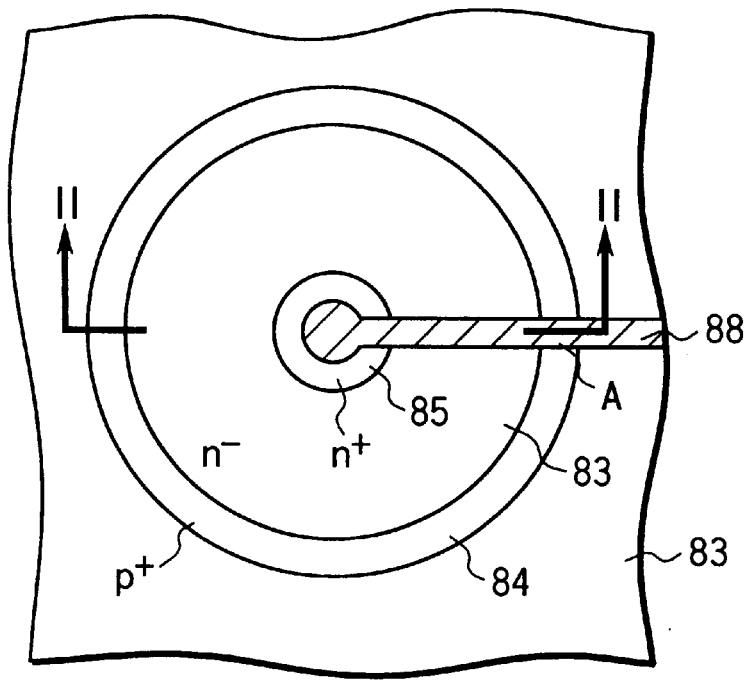
FIG. 1 is a plan view of the conventional lateral type high breakdown voltage diode.
Figure 2:
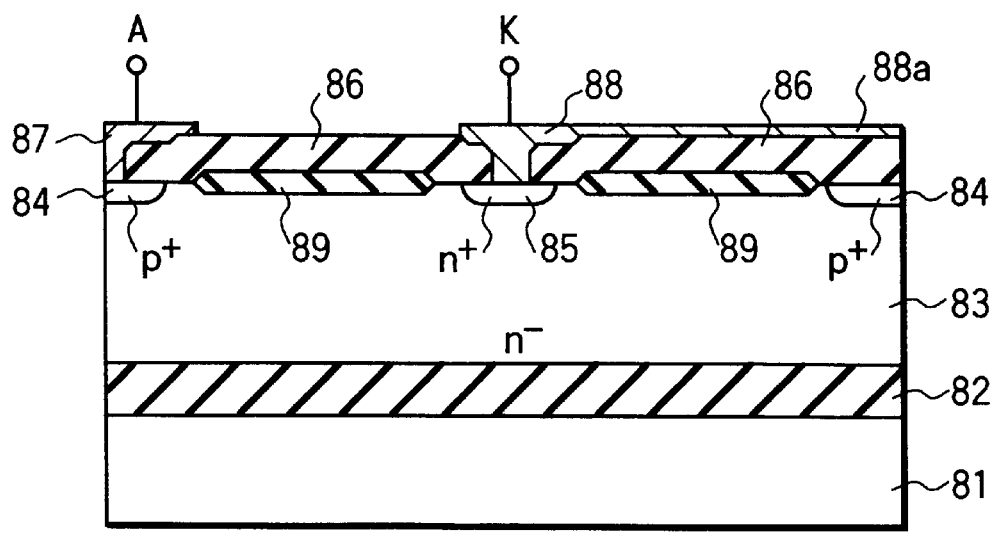
FIG. 2 is a sectional view of the diode shown in FIG. 1, taken along a line II—II.

In FIGS. 3 and 4, 1 denotes the first silicon substrate above which the second silicon substrate 4 is formed with an $SiO_2$ film 2 and an SIPOS (Semi-Insulating POlycrystalline Silicon) film 3 interposed therebetween.

The first silicon substrate 1, the $SiO_2$ film 2, the SIPOS film 3, and the second silicon substrate 4 constitute an SOI substrate. The SOI substrate is formed by employing the bonding method, the SIMOX method, or the like.

According to the bonding method, the bonding faces of the first and second silicon substrates 1 and 4 are mirror-polished, and the other bonding faces thereof are respectively provided with the $SiO_2$ film 2 and the SIPOS film 3 formed prior to the bonding. The polished bonding faces of the substrates are made adhere to each other in a clean atmosphere, and then subjected to a predetermined heat treatment to joint to each other.

The second silicon substrate 4 having an n-type (hereinafter referred to as an "n-type drift layer") is provided at the surface thereof with a p-type anode layer 5 and a n-type cathode layer 6 which are selectively formed by diffusion to have high impurity concentration.

A p-type resurf layer 7 is selectively formed by diffusion in the space between the p-type anode layer 5 and the n-type cathode layer 6 on the surface of the high resistance semiconductor layer. The impurity concentration of the n-type drift layer 4 is around $1\times10^{15}$ cm$^{-3}$, and the impurity dose of the p-type resurf layer 7 is around $1\times10^{12}$ cm$^{-2}$.

Above the n-type drift layer 4, an interlayer insulating film 8 is formed. Through contact holes formed in the interlayer insulating film 8, an anode electrode 9 and a cathode electrode 10 contact to the p-type anode layer 5 and the n-type cathode layer 6.

The p-type resurf layer 7 is provided with an LOCOS film 11 selectively formed thereon. The insulating film provided under the interconnection wire 10a of the cathode electrode 10 is formed thicker thereby, and thus the breakdown voltage of the diode can be increased.

According to the present embodiment, the SIPOS film 3 is formed under the bottom of the n-type drift layer 4, and thus the voltage to be applied to the n-type drift layer 4 can be effectively shared by the SiO$_2$ film 2, and the level of the voltage applied to the n-type drift layer 4 is decreased.

The SIPOS film 3 also has a function as a kind of shield plate for shielding an electric field originating in the silicon substrate 1.

Accordingly, when the diode may has the breakdown voltage equivalent to that of the conventional device, the impurity concentration of the n-type drift layer 4 can be increased, and thus the ON resistance of the diode can be easily decreased. Further, the n-type drift layer 4 can be formed thin, and thus the elements in a device (a power IC) can be easily isolated from each other. In another case where an n-type drift layer 4 has a thickness equivalent to that of a conventional one, the breakdown voltage can be increased. Moreover, the n-type drift layer 4 can be formed thin, and the ON resistance can be increased. As should be clear from the above, according to the present embodiment, the deterioration of the breakdown voltage or the increase in the ON resistance can be prevented.

Additionally, according to the present embodiment, the p-type resurf layer 7 formed in the space between the p-type anode layer 5 and the n-type cathode layer 6 on the n-type drift layer 4 decrease the potential inclination formed horizontally on the element surface between the p-type anode layer 5 and the n-type cathode layer 6. In other words, the electric field on the layer can be formed more uniform in comparing with the conventional device.

Accordingly, when the diode has the breakdown voltage equivalent to that of the conventional device, the device can be decreased in a chip size. While, when the diode may be formed to have the similar chip size to that of the conventional one, the breakdown voltage on the element surface can be increased. Therefore, according to the present embodiment, the increase of the device in the chip size or the deterioration of breakdown voltage can be prevented.

Further, according to the present invention, the p-type anode layer 5 is not formed under the cathode electrode 10a as shown in FIG. 3. According to the conventional device as shown in FIG. 1, the breakdown voltage may be deteriorated at the crossing point A of the p-type anode layer 5 and the cathode electrode when a high voltage is applied to the cathode electrode. Such a breakdown voltage deterioration will not occur in the structure shown in the present embodiment. Accordingly, the cathode electrode 10a can be connected to the high-side circuit with safety.

The Second Embodiment

Figure 5:
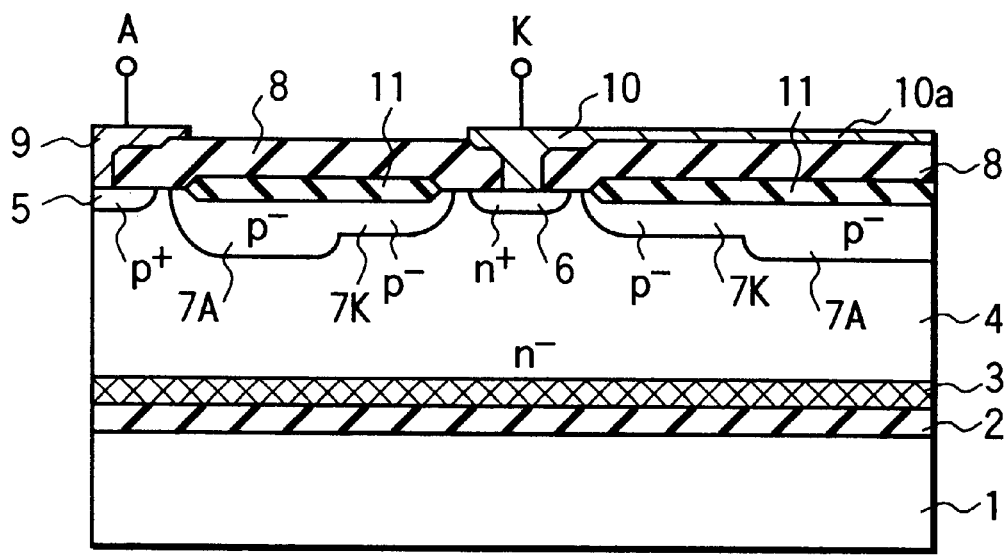
FIG. 5 is a plan view of the lateral type high breakdown voltage diode according to the second embodiment of the present invention.

FIG. 5 is a schematic plane view of the lateral type high breakdown voltage diode according to the second embodiment of the present invention. The same elements as in FIG. 4 are denoted as in the description of FIG. 4, and the detailed description thereof will be omitted here.

The present embodiment differs from the first embodiment in the point that the p-type resurf layer has steps in the horizontal direction.

The p-type resurf layer $7_K$ on the cathode side has relatively low impurity concentration, and the p-type resurf layer $7_A$ on the anode side has relatively high impurity concentration. In short, the p-type resurf layer 7 has an impurity concentration inclination which increases towards the anode side. With such an impurity concentration inclination, when the chip size of the element is the same as the first embodiment, the potential inclination in the horizontal direction on the element surface can be decreased less than that of the first embodiment. As a result, the breakdown voltage can be increased more than that of the first embodiment. When the device may have the same breakdown voltage as that of the first embodiment, the chip size of the element can be decreased less than that of the first embodiment.

Figure 6:
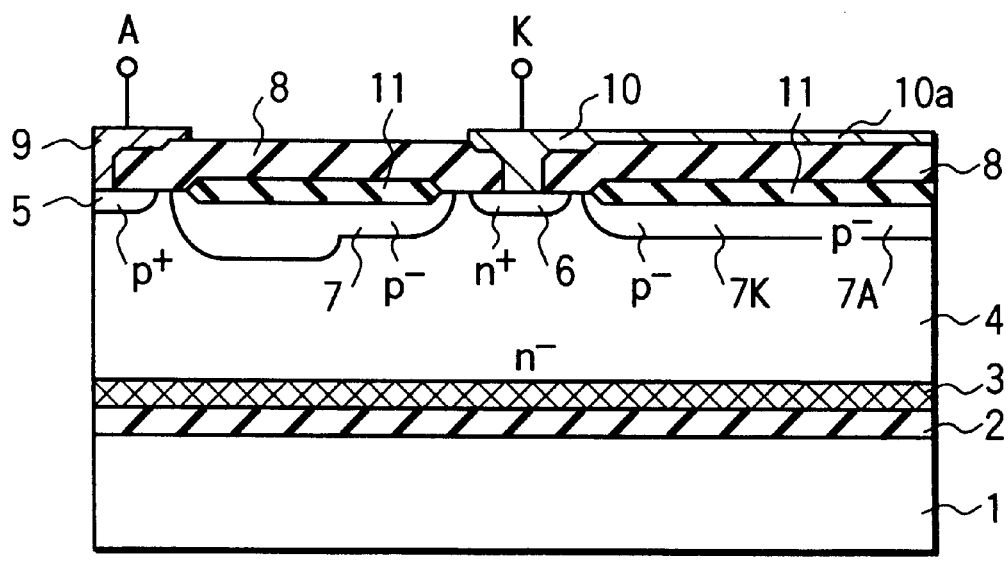
FIG. 6 is a sectional view showing a modification of the diode shown in FIG. 5.

FIG. 6 is a sectional view showing a modification of the diode shown in FIG. 5.

In the device shown in FIG. 5 is formed such that the p-type resurf layer 7 has the impurity concentration distributed symmetrically with respect to the center of the n-type cathode layer 6. The impurity inclination, however, may be formed only on the side of the p-type anode layer, as shown in FIG. 6. Also with this structure, the potential inclination between the p-type anode layer 5 and the n-type cathode layer 6 can be sufficiently decreased.

In the present embodiment, the impurity concentration of the p-type resurf layer has two steps in the horizontal direction, but may have steps more than two which are formed to decline from the p-type anode layer 5 toward the n-type cathode layer 6, in order. As the number of the steps of the p-type resurf layer increases, the potential inclination between the p-type anode layer 5 and the n-type cathode layer 6 can be more effectively smoothened.

The Third Embodiment

Figure 7:
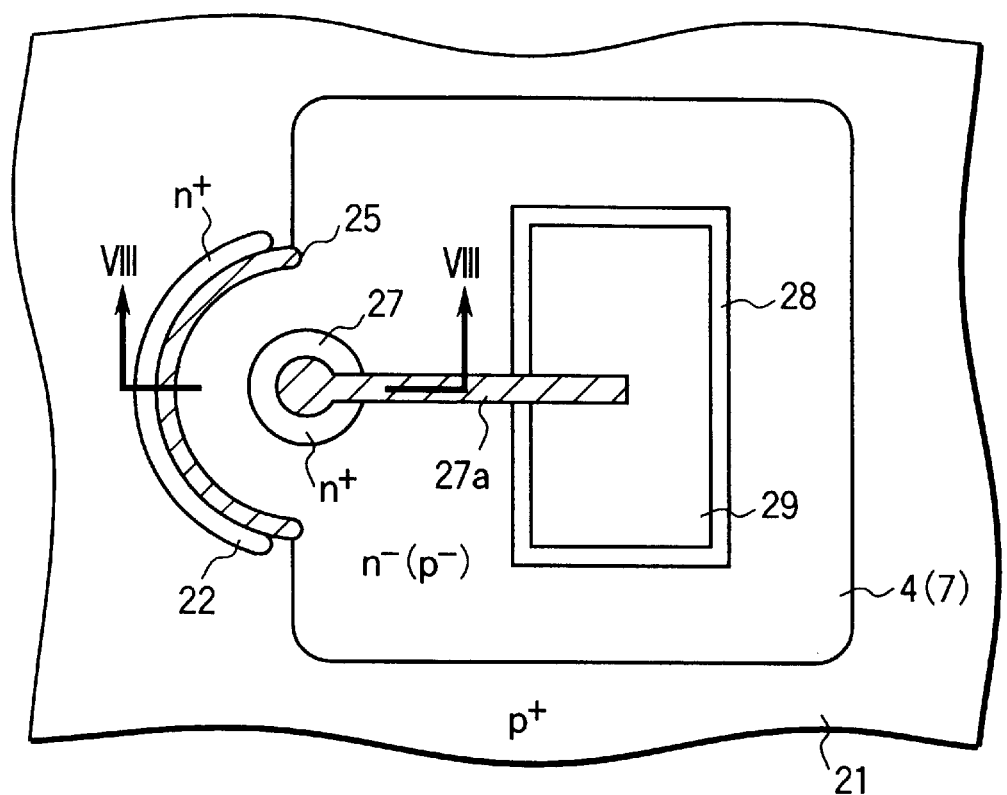
FIG. 7 is a plan view of the lateral type high breakdown voltage MOSFET according to the third embodiment of the present invention.
Figure 8:
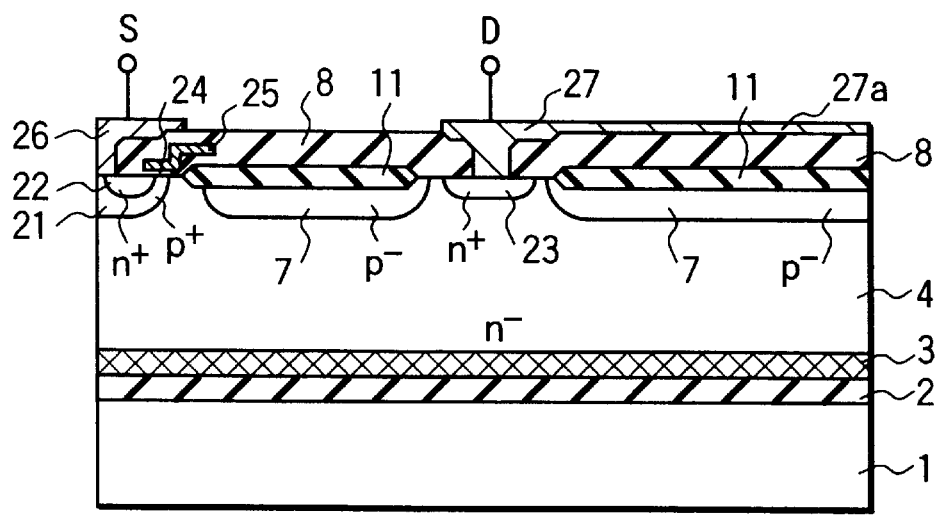
FIG. 8 is a sectional view of the diode shown in FIG. 7, taken along a line VIII—VIII.

FIG. 7 is a plan view of the lateral type high breakdown voltage MOSFET according to the third embodiment of the present invention. FIG. 8 is a sectional view of the diode shown in FIG. 7, taken along a line VIII—VIII. FIG. 7 also shows a high breakdown voltage circuit forming region 29 isolated by a trench 28. Also in this drawing, the elements corresponding those shown in FIG. 4 are denoted by the same reference numerals as in FIG. 4.

A p-type base layer 21 is formed selectively on the surface of the n-type drift layer 4. The p-type base layer 21 is provided with an n-type source diffusion layer 22 formed selectively on the surface thereof. The surface of the n-type drift layer 4 is also provided with an n-type drain diffusion layer 23 selectively formed thereon with high impurity concentration, to be apart from the p-type base layer 21.

The p-type resurf layer 7 is selectively formed by diffusion in the space between the p-type base layer 21 and the n-type drain layer 23 on the surface of the n-type drift layer 4.

A gate electrode 25 is formed in the space between the n-type source 22 and the p-type drift layer 4 above the surface of the p-type base layer 21, so as to have a gate insulating film 24 therebetween.

The interlayer insulating film 8 is formed on the n-type drift layer 4. Through contact holes formed in the interlayer insulating film 8, a source electrode 26 and a drain electrode 27 are brought into contact with the n-type source 22 and the n-type drain layer 23, respectively. 27a denotes an interconnection wire to the drain electrode.

Figure 9:
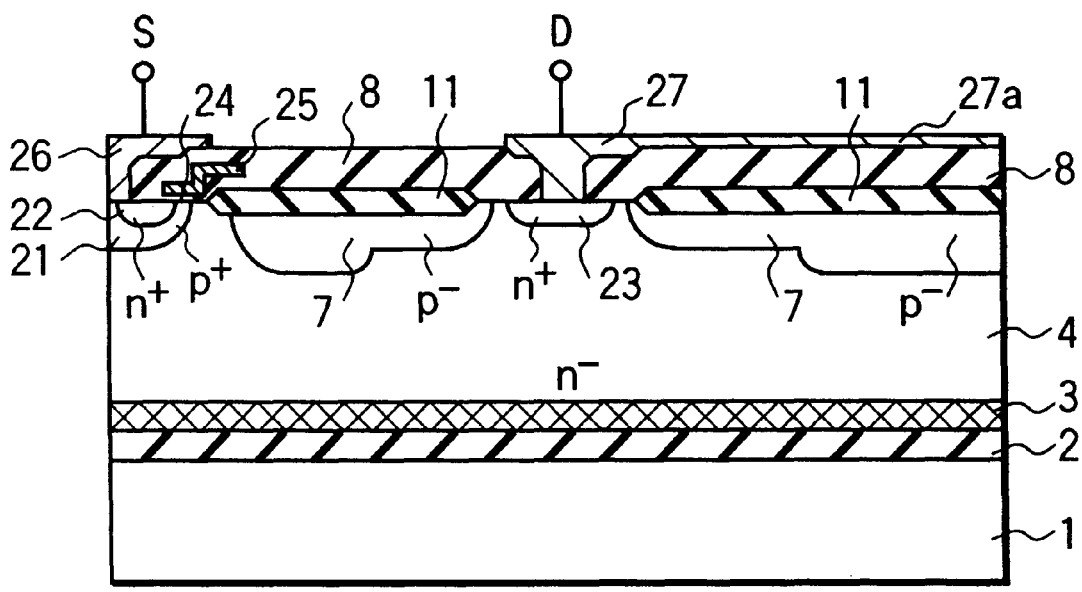
FIG. 9 is a sectional view showing a modification of the MOSFET shown in FIG. 8.
Figure 10:
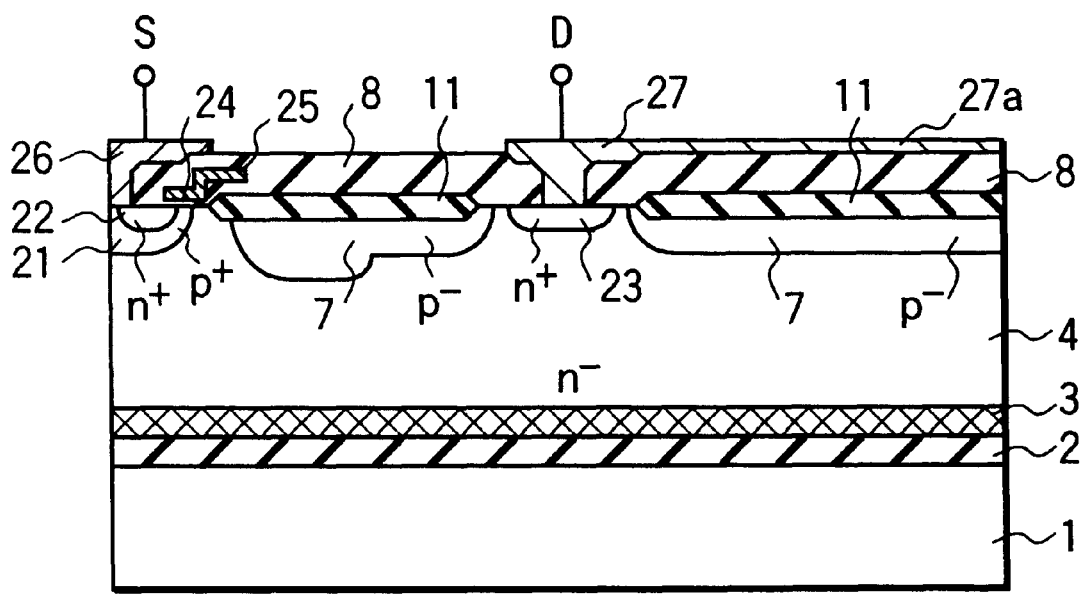
FIG. 10 is a sectional view showing another modification of the MOSFET shown in FIG. 8.

The same effect can be attained also in the present embodiment: the SIPOS film 3 is formed on the insulating layer 2, and thus the breakdown voltage of the MOSFET can be increased. Further, the p-type resurf layer 7 provided to the device can decrease the potential inclination between the drain and the source. As shown in FIGS. 9 and 10, the p-type resurf layer 7 may be formed to have steps as formed in the second embodiment. The n-type source layer 22 and the interconnection wire 27a of the drain electrode 27 do not cross each other as shown in FIG. 7, and thus the drain electrode can be applied with a high voltage with safety.

Figure 11:
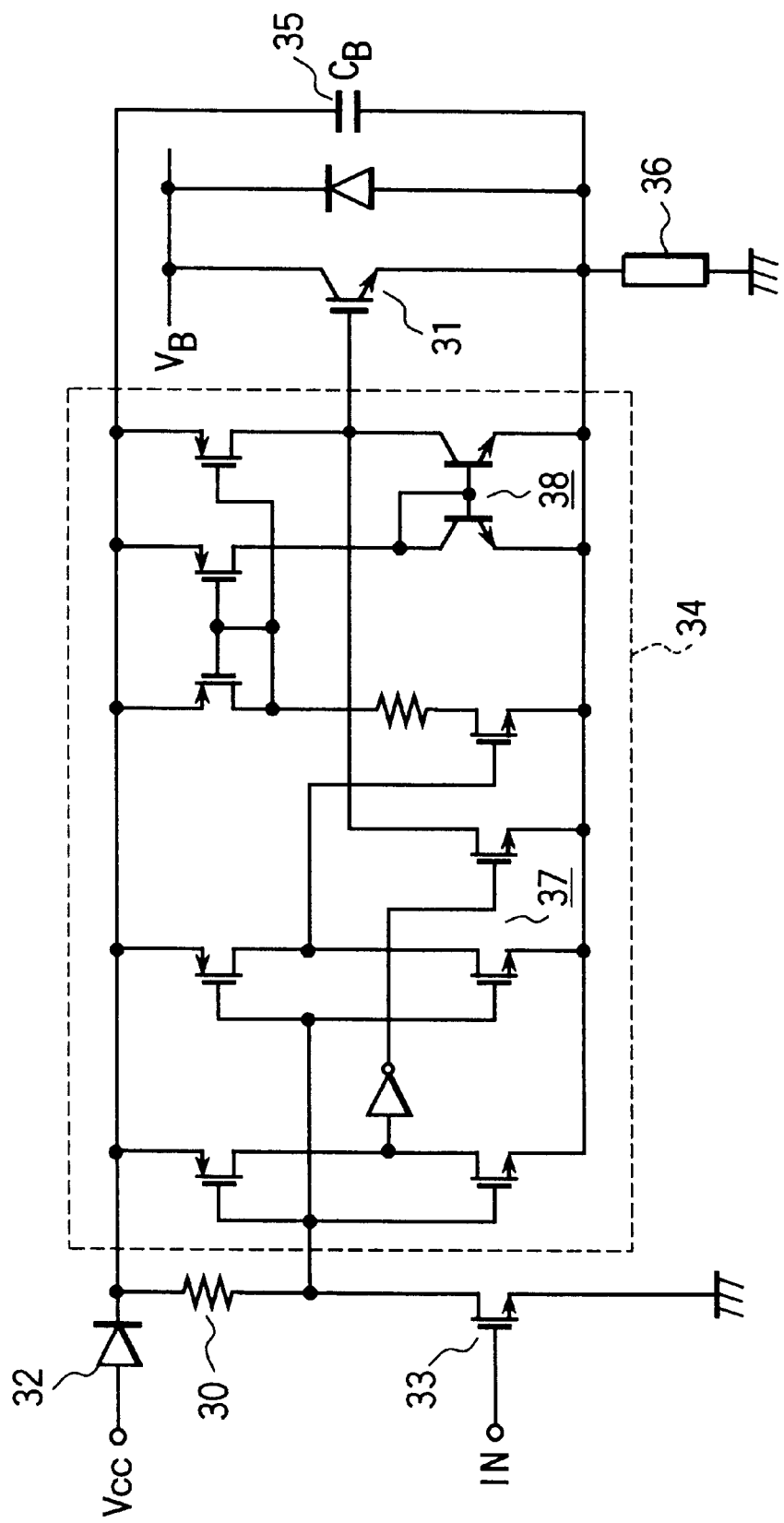
FIG. 11 is a circuit diagram showing one example of a high-side driving circuit of a power IC, in which a switching element is located on a high-side with respect to a load.

The modification of the MOSFET according to the present embodiment will be described below in detail. FIG. 11 is a schematic circuit diagram of a high-side driving circuit of a power IC in which a switching element (IGBT) 31 is located on a high-side with respect to a load 36. An MOSFET 33 is a high breakdown voltage MOSFET for level-shifting, which transfers an input signal (IN) from a logic circuit (not shown) on a low-side to the high-side of the device. When the MOSFET 33 receives the input having a low level from the logic circuit, an inverter chain 37 in the high-side block 34 makes a short circuit occur between the gate and the source of the IGBT 31, and the IGBT 31 is left to be turned off. In this time, the source of the IGBT 31 has a potential of the ground level, and a bootstrap capacitor CB is charged by a logic power source $V_{CC}$ having a voltage of several volts through a high breakdown voltage bootstrap diode 32.

On the other hand, when the logic input signal IN is set at a high level, the gate of the IGBT 31 is supplied with an electric current by a high current mirror circuit 38 comprising bipolar elements to increase the gate voltage, and the IGBT 31 is turned on. In this time, the potential of the source of the IGBT becomes to be a high level as high as several hundreds to several thousands volts, and the bootstrap diode 32 is reversely biased. The current flowing the bootstrap diode 32 then turns to flow into the level shift MOSFET 33 through a resistor 30. As should be clear from the above, when the above-mentioned high breakdown voltage elements are integrated on one chip to form a power IC, the elements or element regions have to be isolated by trenches so as not to adversely affect the other circuits.

Figure 12:
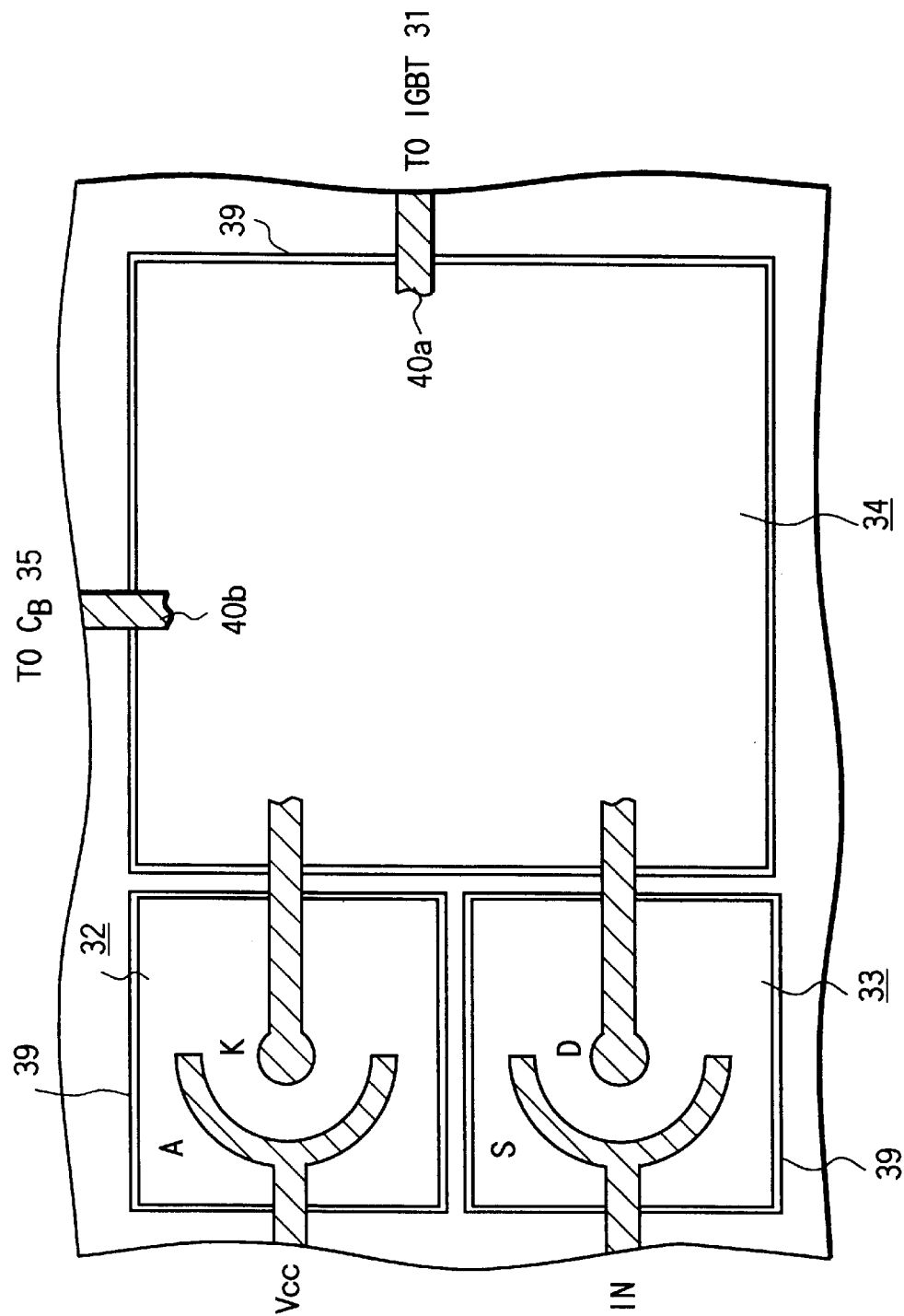
FIG. 12 is a plan view showing an example of the structure of the power IC shown in FIG. 11.

FIG. 12 is a schematic plane view showing an example of the structure of the power IC described above. In the device shown in this drawing, the high breakdown voltage bootstrap diode 32, the high breakdown voltage level shift MOSFET 33, and the high breakdown voltage circuit section 34 are formed on one chip. These elements are isolated by trenches 39 from each other. The high breakdown voltage diode in the first or second embodiment can be used as the bootstrap 32, and as the level shift MOSFET 33, the high breakdown voltage MOSFET in the third embodiment can be used.

Figure 13:
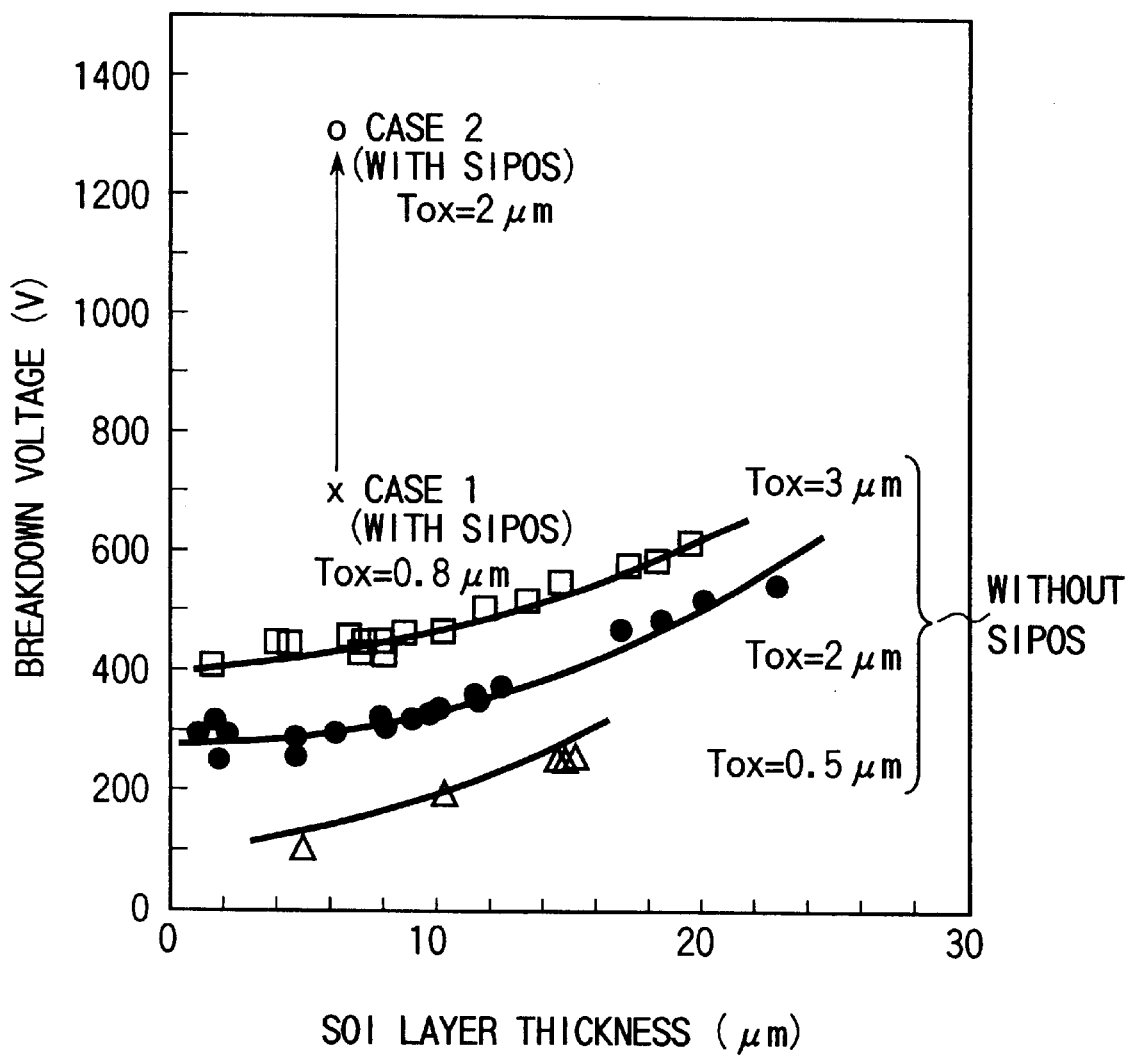
FIG. 13 is a characteristic graph showing the effect of the high resistance film of the high breakdown voltage diode according to the first embodiment of the present invention.

FIG. 13 is a graph showing the change of the breakdown voltage of the high breakdown voltage diode in proportion to the change of the SOI layer thickness. In the graph, the devices having various thickness $T_{OX}$ of the SiO$_2$ film 2 are shown to compare their breakdown voltages: CASE 1 and CASE 2 show the device having the SIPOS film, and the three curves in the graph show the device having no SIPOS film. In CASE 1 and CASE 2, the thicknesses of the SIPOS films are both set at 0.8 μm. As should be clear from this graph, the breakdown voltage of 600 V can be attained with use of the SIPOS film even though the thickness $T_{OX}$ of the SiO$_2$ film 2 is as thin as 0.8 μm, and when the SiO$_2$ film 2 has a thickness of 2 μm as shown in the CASE 2, the breakdown voltage as high as 1300 V can be attained.

It is noted that the present invention is not limited to the embodiments described above. For example, the diode and the MOSFET are described in the embodiments as the high breakdown voltage semiconductor element having an SOI substrate, but the present invention can be applied to the other high breakdown voltage semiconductor element such as an IGBT (IEGT).

As described above, the present invention forms a high resistance film at the bottom of the semiconductor layer of the SOI substrate and a resurf layer on the semiconductor layer of the SOI substrate, thereby to realize the high breakdown voltage semiconductor element capable of preventing the deterioration of the breakdown voltage or the increase of the ON resistance, and preventing the increase of the device chip size or the deterioration of the breakdown voltage.

Further, the present invention forms the p-type anode layer of the diode or the n-type source layer of the MOSFET not to cross with the interconnection wire of the n-type cathode electrode or the n-type drain electrode, thereby to realize a high breakdown voltage IC with high reliability.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity type formed on the surface of the first semiconductor layer so as to be apart from the second semiconductor layer, and having an impurity concentration higher than that of the first semiconductor layer; and a resurf layer formed in a region between the second semiconductor layer and the third semiconductor layer on the surface of the first semiconductor layer, and having an impurity concentration lower than that of the second semiconductor layer, wherein the resurf layer has an impurity concentration inclination in which an impurity concentration on a side of the second semiconductor layer is higher than that on a side of the third semiconductor layer.

2. The high breakdown voltage semiconductor device according to claim 1, wherein the resurf layer is formed to surround the third semiconductor layer.

3. The high breakdown voltage semiconductor device according to claim 1, further comprising an interconnection wire which is connected to the third semiconductor layer, and extends in one direction on the first semiconductor layer, wherein the second semiconductor layer surrounds the third semiconductor layer so as to have an opening, and the interconnection wire extends outside the second semiconductor layer through the opening.

4. The high breakdown voltage semiconductor device according to claim 3, further comprising an insulating layer formed on the first semiconductor layer, the insulating layer being formed thicker under at least one portion of the interconnection wire than the other portion thereof.

5. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity type formed on the surface of the first semiconductor layer so as to be apart from the second semiconductor layer, and having an impurity concentration higher than that of the first semiconductor layer; and a resurf layer formed in a region between the second semiconductor layer and the third semiconductor layer on the surface of the first semiconductor layer so as to surround the third semiconductor layer, said resurf layer having an impurity concentration lower than that of the second semiconductor layer and unevenly distributed so that the impurity concentration of the resurf layer is higher in a portion nearer to the second semiconductor layer than the third semiconductor layer.

6. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity tape formed on the surface of the first semiconductor layer so as to be apart from the second semiconductor layer, and having an impurity concentration higher than that of the first semiconductor layer;

a resurf layer selectively formed in a region between the second semiconductor layer and the third semiconductor layer on the surface of the first semiconductor layer, and having an impurity concentration lower than that of the second semiconductor layer;

a forth semiconductor layer of the first conductivity type having an impurity concentration higher than that of the first semiconductor layer, which is formed on the second semiconductor layer; and a gate electrode formed in a space between the fourth semiconductor layer and the first semiconductor layer above a surface of the second semiconductor layer, with a gate insulating film interposed between the gate electrode and the semiconductor layers wherein the resurf layer has an impurity concentration inclination in which an impurity concentration on a side of the second semiconductor layer is higher than that on a side of the third semiconductor layer.

7. The high breakdown voltage semiconductor device according to claim 6, wherein the resurf layer is formed to surround the third semiconductor layer.

8. The high breakdown voltage semiconductor device according to claim 6, further comprising an interconnection wire which is connected to the third semiconductor layer, and extends in one direction on the first semiconductor layer, wherein the second semiconductor layer surrounds the third semiconductor layer so as to have an opening, and the interconnection wire extends outside the second semiconductor layer through the opening.

9. The high breakdown voltage semiconductor device according to claim 8, further comprising an insulating layer formed on the first semiconductor layer, the insulating layer being formed thicker under at least one portion of the interconnection wire than the other portion thereof.

10. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity type formed on the surface of the first semiconductor layer so as to be apart from the second semiconductor layer, and having an impurity concentration higher than that of the first semiconductor layer;

a resurf layer selectively formed in a region between the second semiconductor layer and the third semiconductor layer on the surface of the first semiconductor layer so as to surround the third semiconductor layer, said resurf layer having an impurity concentration lower than that of the second semiconductor layer and unevenly distributed so that the impurity concentration of the resurf layer is higher in a portion nearer to the second semiconductor layer than the third semiconductor layer;

a fourth semiconductor layer of the first conductivity type having an impurity concentration higher than that of the first semiconductor layer, which is formed on the second semiconductor layer; and a gate electrode formed in a space between the fourth semiconductor layer and the first semiconductor layer above a surface of the second semiconductor layer, with a gate insulating film interposed between the gate electrode and the second semiconductor layer.

11. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity type formed on the surface of the first semiconductor layer so as to be apart from the second semiconductor layer, and having an impurity concentration higher than that of the first semiconductor layer;

a resurf layer formed in a region between the second semiconductor layer and the third semiconductor layer on the surface of the first semiconductor layer, and having an impurity concentration lower than that of the second semiconductor layer;

a fourth semiconductor layer of the first conductivity type having an impurity concentration higher than that of the first semiconductor layer, which is formed on the second semiconductor layer;

a gate electrode formed in a space between the fourth semiconductor layer and the first semiconductor layer above a surface of the second semiconductor layer, with a gate insulating film interposed between the gate electrode and the second semiconductor layer; and a semiconductor element forming region isolated by a trench formed in a region on the first semiconductor layer other than regions in which the second semiconductor layer and the third semiconductor layer are formed, the semiconductor element forming region having at least one semiconductor element formed therein, wherein the resurf layer has an impurity concentration inclination in which an impurity concentration on a side of the second semiconductor layer is higher than that on a side of the third semiconductor layer.

12. The high breakdown voltages semiconductor device according to claim 11, wherein the resurf layer is formed to surround the third semiconductor layer.

13. The high breakdown voltage semiconductor device according to claim 11, further comprising an interconnection wire which is connected to the third semiconductor layer, and extends in one direction on the first semiconductor layer, wherein the second semiconductor layer surrounds the third semiconductor layer so as to have an opening, and the interconnection wire extends outside the second semiconductor layer through the opening and is connected to the semiconductor element in the semiconductor element forming region.

14. The high breakdown voltage semiconductor device according to claim 13, further comprising an insulating layer formed on the first semiconductor layer, the insulating layer being formed thicker under at least one portion of the interconnection wire from the other portion thereof.

15. A high breakdown voltage semiconductor device comprising:

an insulating film;

a semi-insulating high resistance film formed on the insulating film;

a first semiconductor layer of a first conductivity type formed on the high resistance film;

a second semiconductor layer of a second conductivity type formed on a surface of the first semiconductor layer;

a third semiconductor layer of the first conductivity type formed on the surface of the first semiconductor layer so as to be apart from the second semiconductor layer, and having an impurity concentration higher than that of the first semiconductor layer;

a resurf layer formed in a region between the second semiconductor layer and the third semiconductor layer on the surface of the first semiconductor layer so as to surround the third semiconductor layer, said resurf layer having an impurity concentration lower than that of the second semiconductor layer and unevenly distributed so that the impurity concentration of the resurf layer is in a portion nearer to the second semiconductor layer than the third semiconductor layer;

a fourth semiconductor layer of the first conductivity type having an impurity concentration higher than that of the first semiconductor layer, which is formed on the second semiconductor layer;

a gate electrode formed in a space between the fourth semiconductor layer and the first semiconductor layer above a surface of the second semiconductor layer, with a gate insulating film interposed between the gate electrode and the second semiconductor layer; and a semiconductor element forming region isolated by a trench formed in a region on the first semiconductor layer other than regions in which the second semiconductor layer and the third semiconductor layer are formed, the semiconductor element forming region having at least one semiconductor element formed therein.

* * * * *